(12) United States Patent
Go et al.

(10) Patent No.: US 11,139,354 B2
(45) Date of Patent: Oct. 5, 2021

(54) DISPLAY APPARATUS

(71) Applicant: SAMSUNG DISPLAY CO., LTD., Yongin-si (KR)

(72) Inventors: Jaekyung Go, Yongin-si (KR); Eunjae Na, Yongin-si (KR); Minjun Jo, Yongin-si (KR); Hyunjun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/897,180

(22) Filed: Jun. 9, 2020

(65) Prior Publication Data

US 2020/0303475 A1 Sep. 24, 2020

Related U.S. Application Data

(63) Continuation of application No. 14/677,085, filed on Apr. 2, 2015, now Pat. No. 10,680,044.

(30) Foreign Application Priority Data

Sep. 16, 2014 (KR) .................. 10-2014-0122934

(51) Int. Cl.
*H01L 29/18* (2006.01)
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/525* (2013.01); *H01L 51/5246* (2013.01)

(58) Field of Classification Search
CPC ............ H01L 27/3246; H01L 27/3276; H01L 51/5246; H01L 51/525
See application file for complete search history.

(56) References Cited

U.S. PATENT DOCUMENTS 6,031,593 A 2/2000 Morikawa et al.
6,067,134 A 5/2000 Akiyama et al.
(Continued)

FOREIGN PATENT DOCUMENTS

KR 2002-0069737 A 9/2002
KR 10-2003-0001572 A 1/2003
(Continued)

OTHER PUBLICATIONS

U.S. Office Action dated Jan. 11, 2018 corresponding to U.S. Appl. No. 15/616,580.

*Primary Examiner* — Jay C Kim
(74) *Attorney, Agent, or Firm* — Lewis Roca Rothgerber Christie LLP

(57) ABSTRACT

A display apparatus includes a first substrate including an active area, a circuit area extending outwardly from the active area, and a cell seal area extending outwardly from the circuit area, a second substrate covering the first substrate, a sealing portion between the first substrate and the second substrate, the sealing portion covering at least a portion of the circuit area, a circuit line in the circuit area of the first substrate and electrically connected to a device in the active area of the first substrate, at least a portion of the sealing portion being on the circuit line, and a pixel definition layer between the sealing portion and the circuit line.

15 Claims, 4 Drawing Sheets

(56) References Cited

U.S. PATENT DOCUMENTS

| | | | |
|---|---|---|---|
| 6,069,443 A | 5/2000 | Jones et al. | |
| 6,274,887 B1 | 8/2001 | Yamazaki et al. | |
| 6,359,606 B1 | 3/2002 | Yudasaka | |
| 6,380,687 B1 | 4/2002 | Yamazaki | |
| 6,420,834 B2 | 7/2002 | Yamazaki et al. | |
| 6,483,484 B1* | 11/2002 | Yamazaki | A61B 5/16 345/8 |
| 6,506,636 B2 | 1/2003 | Yamazaki et al. | |
| 6,531,713 B1 | 3/2003 | Yamazaki | |
| 6,559,594 B2 | 5/2003 | Fukunaga et al. | |
| 6,572,987 B2 | 6/2003 | Seo | |
| 6,573,952 B1* | 6/2003 | Yamazaki | G02B 27/017 349/11 |
| 6,593,691 B2 | 7/2003 | Nishi et al. | |
| 6,605,826 B2* | 8/2003 | Yamazaki | H01L 51/524 257/72 |
| 6,614,076 B2 | 9/2003 | Kawasaki et al. | |
| 6,664,732 B2 | 12/2003 | Yamazaki et al. | |
| 6,690,033 B2 | 2/2004 | Yamazaki et al. | |
| 6,706,544 B2 | 3/2004 | Yamazaki et al. | |
| 6,740,190 B2 | 5/2004 | Takase | |
| 6,788,278 B2 | 9/2004 | Aoki | |
| 6,798,132 B2 | 9/2004 | Satake | |
| 6,822,264 B2 | 11/2004 | Yamazaki et al. | |
| 6,830,994 B2 | 12/2004 | Mitsuki et al. | |
| 6,900,462 B2 | 5/2005 | Suzawa et al. | |
| 6,958,490 B2 | 10/2005 | Okamoto et al. | |
| 6,965,195 B2 | 11/2005 | Yamazaki et al. | |
| 6,992,332 B2 | 1/2006 | Yamazaki et al. | |
| 7,037,157 B2 | 5/2006 | Murakami et al. | |
| 7,045,822 B2 | 5/2006 | Tsuchiya | |
| 7,045,861 B2 | 5/2006 | Takayama et al. | |
| 7,064,482 B2 | 6/2006 | Park | |
| 7,097,916 B2 | 8/2006 | Seo et al. | |
| 7,098,069 B2 | 8/2006 | Yamazaki et al. | |
| 7,129,623 B2 | 10/2006 | Chou et al. | |
| 7,148,944 B2* | 12/2006 | Kinoshita | G02F 1/133305 349/158 |
| 7,154,218 B2 | 12/2006 | Murakami et al. | |
| 7,158,104 B2 | 1/2007 | Koyama | |
| 7,196,465 B2 | 3/2007 | Park et al. | |
| 7,221,095 B2 | 5/2007 | Yamazaki et al. | |
| 7,230,271 B2 | 6/2007 | Yamazaki et al. | |
| 7,230,593 B2 | 6/2007 | Nakanishi | |
| 7,303,635 B2 | 12/2007 | Yamaguchi | |
| 7,332,858 B2 | 2/2008 | Nomura et al. | |
| 7,399,991 B2* | 7/2008 | Seo | H01L 51/5036 257/40 |
| 7,423,373 B2 | 9/2008 | Sakakura et al. | |
| 7,452,257 B2 | 11/2008 | Tsuchiya et al. | |
| 7,473,928 B1 | 1/2009 | Yamazaki et al. | |
| 7,474,375 B2 | 1/2009 | Kwak et al. | |
| 7,486,368 B2 | 2/2009 | Sakakura et al. | |
| 7,538,488 B2 | 5/2009 | Kwak | |
| 7,541,734 B2 | 6/2009 | Yamazaki et al. | |
| 7,550,772 B2 | 6/2009 | Toyota et al. | |
| 7,592,207 B2 | 9/2009 | Nakamura et al. | |
| 7,598,927 B2* | 10/2009 | Yamazaki | B60W 50/14 345/7 |
| 7,611,965 B2 | 11/2009 | Suzuki et al. | |
| 7,619,258 B2 | 11/2009 | Tsuchiya et al. | |
| 7,619,286 B2 | 11/2009 | Park | |
| 7,671,369 B2 | 3/2010 | Yamazaki et al. | |
| 7,679,284 B2 | 3/2010 | Kubota | |
| 7,688,290 B2* | 3/2010 | Yamazaki | G09G 3/3233 345/77 |
| 7,701,132 B2 | 4/2010 | Oh | |
| 7,728,510 B2 | 6/2010 | Oh | |
| 7,750,999 B2 | 7/2010 | Park | |
| 7,753,751 B2 | 7/2010 | Yamazaki | |
| 7,775,845 B2 | 8/2010 | Fukase et al. | |
| 7,791,268 B2* | 9/2010 | Jung | H01L 27/3246 313/504 |
| 7,791,270 B2 | 9/2010 | Tsuchiya et al. | |
| 7,812,523 B2* | 10/2010 | Jung | H01L 27/3276 313/506 |
| 7,817,227 B2 | 10/2010 | Lee et al. | |
| 7,839,081 B2 | 11/2010 | Kubota et al. | |
| 7,863,612 B2 | 1/2011 | Sato | |
| 7,872,255 B2 | 1/2011 | Yoshinaga | |
| 7,893,614 B2 | 2/2011 | Kang | |
| 7,928,654 B2 | 4/2011 | Tsuchiya et al. | |
| 7,968,453 B2 | 6/2011 | Tanaka et al. | |
| 7,977,678 B2 | 7/2011 | Yamazaki et al. | |
| 7,989,812 B2 | 8/2011 | Yamazaki et al. | |
| 7,990,060 B2 | 8/2011 | Ahn et al. | |
| 7,990,061 B2* | 8/2011 | Kim | H05B 33/04 313/512 |
| 7,994,711 B2 | 8/2011 | Nakamura et al. | |
| 8,026,667 B2 | 9/2011 | Kwak et al. | |
| 8,040,059 B2* | 10/2011 | Imai | H01L 23/564 313/512 |
| 8,040,456 B2* | 10/2011 | Yamazaki | G02F 1/1362 349/61 |
| 8,044,404 B2* | 10/2011 | Sung | H01L 27/3246 257/72 |
| 8,044,574 B2 | 10/2011 | Yamazaki et al. | |
| 8,076,844 B2 | 12/2011 | Oda et al. | |
| 8,093,603 B2 | 1/2012 | Jung et al. | |
| 8,120,249 B2 | 2/2012 | Choi et al. | |
| 8,164,252 B2 | 4/2012 | Lee et al. | |
| 8,164,257 B2 | 4/2012 | Choi et al. | |
| 8,188,475 B2 | 5/2012 | Lee et al. | |
| 8,217,396 B2 | 7/2012 | Yamazaki et al. | |
| 8,218,111 B2 | 7/2012 | Kim et al. | |
| 8,222,809 B2 | 7/2012 | Lee et al. | |
| 8,242,692 B2* | 8/2012 | Kim | H01L 51/5268 313/507 |
| 8,253,320 B2 | 8/2012 | Nakanishi et al. | |
| 8,253,327 B2 | 8/2012 | Ibe et al. | |
| 8,258,523 B2* | 9/2012 | Lee | H01L 51/5246 257/91 |
| 8,283,859 B2 | 10/2012 | Amano | |
| 8,304,300 B2 | 11/2012 | Sakata et al. | |
| 8,323,065 B2 | 12/2012 | Kwon et al. | |
| 8,350,466 B2 | 1/2013 | Murakami et al. | |
| 8,357,021 B2 | 1/2013 | Sakakura et al. | |
| 8,362,469 B2 | 1/2013 | Suh | |
| 8,368,299 B2 | 2/2013 | Kim et al. | |
| 8,395,569 B2 | 3/2013 | Min et al. | |
| 8,400,055 B2* | 3/2013 | Naono | H01L 51/5234 313/504 |
| 8,415,881 B2 | 4/2013 | Satake | |
| 8,432,334 B2 | 4/2013 | Bang et al. | |
| 8,441,185 B2 | 5/2013 | Kuwabara et al. | |
| 8,445,915 B2 | 5/2013 | You | |
| 8,455,873 B2 | 6/2013 | Yamazaki et al. | |
| 8,526,216 B2 | 9/2013 | Asami et al. | |
| 8,536,580 B2 | 9/2013 | Kang | |
| 8,587,194 B2 | 11/2013 | Lee et al. | |
| 8,593,595 B2 | 11/2013 | Park et al. | |
| 8,599,177 B2 | 12/2013 | Koyama et al. | |
| 8,604,501 B2 | 12/2013 | Yun et al. | |
| 8,618,546 B2 | 12/2013 | Jeong et al. | |
| 8,629,448 B2 | 1/2014 | Kang et al. | |
| 8,643,002 B2* | 2/2014 | Ryu | H01L 51/524 257/40 |
| 8,703,399 B2 | 4/2014 | Kim et al. | |
| 8,716,933 B2 | 5/2014 | Yamazaki et al. | |
| 8,754,404 B2* | 6/2014 | Jung | H01L 27/322 257/40 |
| 8,772,783 B2 | 7/2014 | Hirosue et al. | |
| 8,836,213 B2 | 9/2014 | Kim et al. | |
| 8,847,246 B2* | 9/2014 | Ryu | H01L 51/524 257/88 |
| 8,853,702 B2 | 10/2014 | Jin et al. | |
| 8,890,151 B2 | 11/2014 | Hong | |
| 8,912,547 B2 | 12/2014 | Matsukura | |
| 8,981,364 B2 | 3/2015 | Hong | |
| 8,988,623 B2 | 3/2015 | Koyama et al. | |
| 8,994,634 B2 | 3/2015 | Jo et al. | |
| 9,001,302 B2 | 4/2015 | Kim et al. | |

(56) References Cited

U.S. PATENT DOCUMENTS

| | | |
|---|---|---|
| 9,012,949 B2 | 4/2015 | Yamazaki et al. |
| 9,035,285 B2 * | 5/2015 | Lee ................... H01L 27/3258 257/40 |
| 9,065,073 B2 | 6/2015 | Choi |
| 9,076,745 B2 * | 7/2015 | Choi ................... H01L 51/5246 |
| 9,076,990 B2 | 7/2015 | Nakamura et al. |
| 9,082,678 B2 * | 7/2015 | Yamazaki ............. H01L 27/323 |
| 9,088,006 B2 * | 7/2015 | Yamazaki ........... H01L 51/5246 |
| 9,147,718 B2 | 9/2015 | Kim |
| 9,153,631 B2 | 10/2015 | Sung et al. |
| 9,166,192 B2 * | 10/2015 | Yamazaki ........... H01L 51/5246 |
| 9,178,174 B2 | 11/2015 | Uesugi et al. |
| 9,236,495 B2 | 1/2016 | Seo et al. |
| 9,281,494 B2 | 3/2016 | Lee et al. |
| 9,305,985 B2 * | 4/2016 | Lee ................... H01L 27/3258 |
| 9,312,319 B2 | 4/2016 | Lee et al. |
| 9,362,531 B2 | 6/2016 | Hong |
| 9,368,751 B2 * | 6/2016 | Heo ................... H01L 51/5246 |
| 9,406,698 B2 * | 8/2016 | Yamazaki ........... H01L 27/1214 |
| 9,411,421 B2 * | 8/2016 | Tamura ................ G02F 1/1339 |
| 9,412,801 B2 | 8/2016 | Choi |
| 9,419,242 B2 * | 8/2016 | Baek ................... H01L 51/525 |
| 9,431,618 B2 * | 8/2016 | Kawata ................ H01L 27/323 |
| 9,478,598 B2 | 10/2016 | Ono et al. |
| 9,494,833 B2 | 11/2016 | Yamazaki et al. |
| 9,502,683 B2 | 11/2016 | Hong et al. |
| 9,570,702 B2 | 2/2017 | Hong |
| 9,600,111 B2 | 3/2017 | Hong et al. |
| 9,780,328 B2 | 10/2017 | Hong et al. |
| 9,825,253 B2 | 11/2017 | Cho et al. |
| 9,837,632 B2 * | 12/2017 | Cho ................... H01L 51/5237 |
| 9,882,163 B2 | 1/2018 | Park |
| 9,905,809 B2 | 2/2018 | Seo et al. |
| 10,134,996 B2 | 11/2018 | Seo et al. |
| 2001/0053559 A1 | 12/2001 | Nagao et al. |
| 2002/0149730 A1 | 10/2002 | Jeong et al. |
| 2003/0132927 A1 | 7/2003 | Ouchi et al. |
| 2005/0040762 A1 | 2/2005 | Kurihara |
| 2005/0048706 A1 | 3/2005 | Shimomura et al. |
| 2006/0060850 A1 | 3/2006 | Kwak et al. |
| 2006/0072047 A1 * | 4/2006 | Sekiguchi ............. G02F 1/1335 349/25 |
| 2006/0088951 A1 | 4/2006 | Hayashi et al. |
| 2007/0013292 A1 * | 1/2007 | Inoue ................... H01L 51/5259 313/504 |
| 2008/0063949 A1 | 3/2008 | Inoue |
| 2008/0277666 A1 | 11/2008 | Jeon et al. |
| 2010/0327737 A1 * | 12/2010 | Hayashi ................ B60Q 3/745 313/504 |
| 2012/0043880 A1 | 2/2012 | Lee |
| 2012/0075781 A1 | 3/2012 | Koh et al. |
| 2012/0181544 A1 | 7/2012 | Lee et al. |
| 2012/0249937 A1 | 10/2012 | Kim et al. |
| 2013/0049003 A1 | 2/2013 | Choi et al. |
| 2013/0069067 A1 | 3/2013 | Youn |
| 2013/0069853 A1 | 3/2013 | Choi |
| 2013/0248867 A1 | 9/2013 | Kim et al. |
| 2013/0299790 A1 | 11/2013 | Kang et al. |
| 2013/0300775 A1 | 11/2013 | Choi et al. |
| 2014/0027729 A1 | 1/2014 | So et al. |
| 2015/0179099 A1 | 6/2015 | Go |
| 2015/0236297 A1 | 8/2015 | Hong et al. |
| 2016/0104863 A1 | 4/2016 | Park |

FOREIGN PATENT DOCUMENTS

| | | |
|---|---|---|
| KR | 10-2007-0047978 | 8/2007 |
| KR | 10-2011-0019498 | 2/2011 |
| KR | 10-2011-0041321 A | 4/2011 |
| KR | 10-2012-0017928 A | 2/2012 |
| KR | 10-2012-0031366 A | 4/2012 |
| KR | 10-2014-0013521 A | 2/2014 |
| KR | 10-2014-0015037 A | 2/2014 |

* cited by examiner

DISPLAY APPARATUS

CROSS-REFERENCE TO RELATED APPLICATIONS

This application is a continuation of U.S. patent application Ser. No. 14/677,085, filed Apr. 2, 2015, which claims priority to and the benefit of Korean Patent Application No. 10-2014-0122934, filed Sep. 16, 2014, the entire content of both of which is incorporated herein by reference.

BACKGROUND

1. Field

One or more exemplary embodiments relate to display apparatuses.

2. Description of the Related Art

In general, display apparatuses, e.g., organic light-emitting display apparatuses including thin film transistors (TFTs), may be used in mobile apparatuses, e.g., smart phones, tablet personal computers (PCs), ultra-slim notebook computers, digital cameras, video cameras, or portable information terminal, and in electronic/electric products, e.g., ultra-thin televisions (TVs). Thus, they come into the spotlight.

For example, in an organic light-emitting display apparatus, a space between an upper substrate and a lower substrate has to be sealed to protect an organic light-emitting device from the outside thereof. To this end, a sealant is interposed between the upper substrate and the lower substrate. Energy is applied to melt the sealant, thereby joining the upper substrate and the lower substrate together. In this case, the structural strength of a sealed portion needs to be maintained.

SUMMARY

One or more exemplary embodiments include display apparatuses that may prevent deformation of a circuit area by foreign substances during a sealing process.

According to one or more exemplary embodiments, a display apparatus includes a first substrate including an active area, a circuit area extending outwardly from the active area, and a cell seal area extending outwardly from the circuit area, a second substrate covering the first substrate, a sealing portion between the first substrate and the second substrate, the sealing portion covering at least a portion of the circuit area, a circuit line in the circuit area of the first substrate and electrically connected to a device in the active area of the first substrate, at least a portion of the sealing portion being on the circuit line, and a pixel definition layer between the sealing portion and the circuit line.

A column portion may be disposed between the circuit line and a top surface of the pixel definition layer.

The pixel definition layer and the column portion may be united together.

A power line through which external power is applied may be included in the circuit area, and the circuit line may be electrically connected to the power line with a step difference therebetween.

A thin film transistor including a source electrode and a drain electrode may be disposed under the circuit line, and a planarization layer may be disposed between the circuit line and the thin film transistor.

The pixel definition layer may extend to an area in which the thin film transistor is disposed.

The column portion may be disposed on the thin film transistor.

A step portion may be disposed between the circuit line and the planarization layer.

The planarization layer and the step portion may be united together.

The step portion may be disposed on the thin film transistor.

The step portion may be a protrusion extending above the planarization layer, the circuit line being conformal on the step portion.

The pixel definition layer may completely separate the sealing portion from the circuit line.

The sealing portion may directly contact the pixel definition layer and the second substrate.

A height of the step portion may be determined according to a pressure that is applied to the circuit line in process of sealing the sealing portion.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
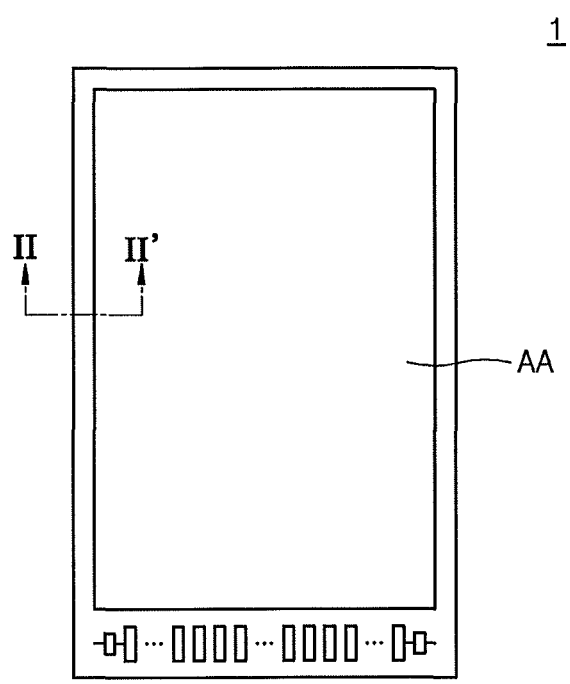
FIG. 1 illustrates a schematic plan view of a portion of a display apparatus according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the at.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, expressions such as "at least one of," when preceding a list of elements, modify the entire list of elements and do not modify the individual elements of the list. In addition, although terms such as "first" and "second" may be used herein to describe various elements, these elements should not be limited by these terms. These terms are only used to distinguish one element from another element.

The terminology used herein is for the purpose of describing particular embodiments only and is not intended to limit. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Figure 2:
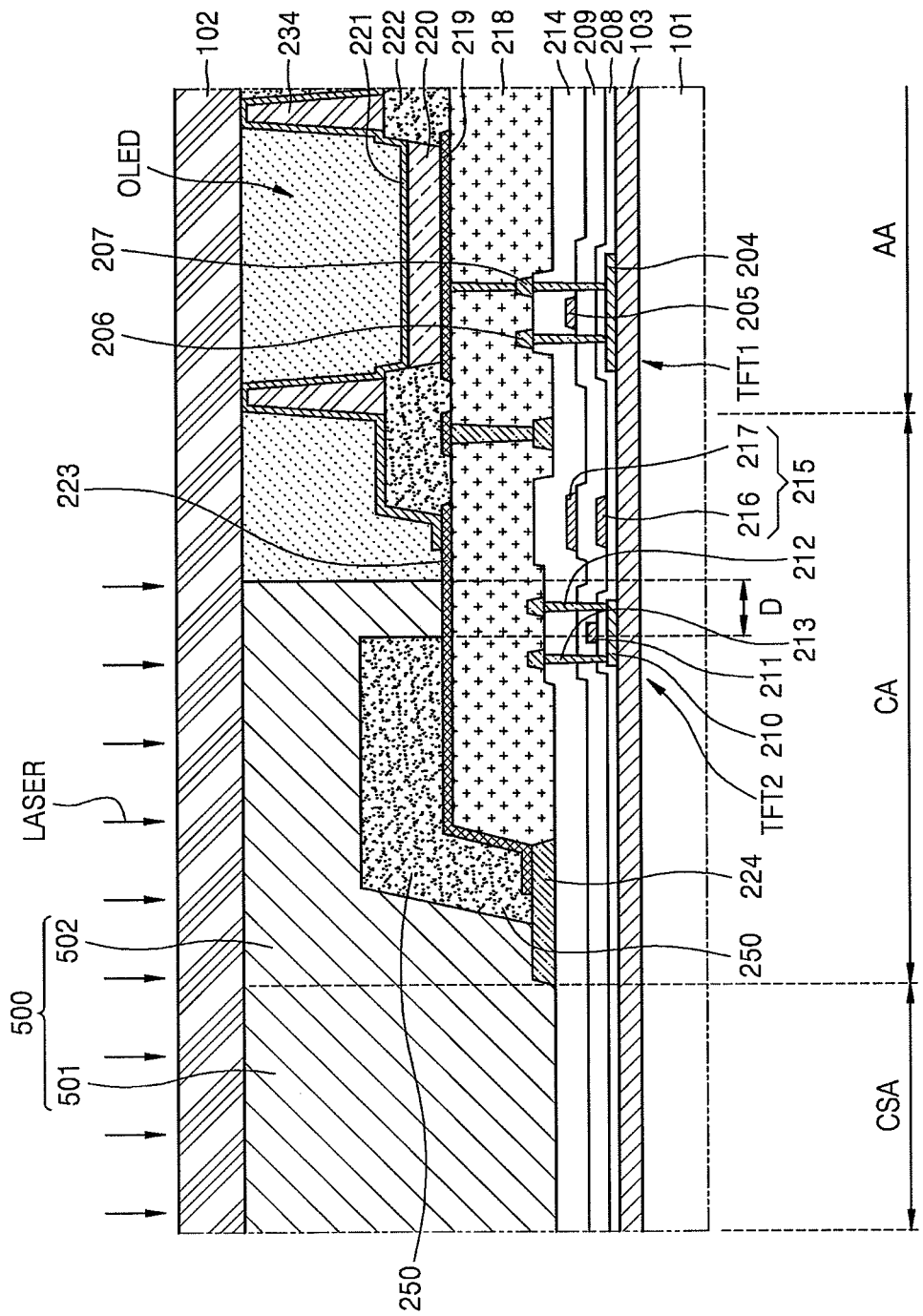
FIG. 2 illustrates a cross-sectional view taken along line II-II' of FIG. 1.

FIG. 1 illustrates a schematic plan view of a display apparatus 1 according to an exemplary embodiment. FIG. 2 is a cross-sectional view of the display apparatus 1 taken along line II-II' of FIG. 1.

In the present embodiment, an organic light-emitting display apparatus is described as an example of the display apparatus 1. However, exemplary embodiments are not limited thereto, and the display apparatus 1 may be any display apparatus that displays an image when a voltage is applied thereto, e.g., a liquid crystal display (LCD) apparatus, a field emission display (FED) apparatus, or an electronic paper display (EPD) apparatus.

Referring to FIGS. 1 and 2, the display apparatus 1 according to an exemplary embodiment may include a first substrate 101, a second substrate 102, an active area AA on the first substrate 101, a circuit area CA extending outward from the active area AA, and a cell seal area CSA extending outward from the circuit area CA.

In a display apparatus, in order to reduce a dead space, i.e., an area irrelevant to the active area displaying an image, a width of the cell seal area or a margin of a cutting area separating the first substrate into individual display devices may be reduced. However, when a width of a sealing portion in the cell seal area is reduced, an adhesive strength between the first substrate and the second substrate may be reduced.

Therefore, according to the present embodiment, in order to both reduce the dead space and increase the adhesive strength between the first substrate 101 and the second substrate 102, a sealing portion 500 may extend in the cell seal area CSA and in the circuit area CA, in which a signal line is disposed. Hereinafter, a detailed configuration will be described with reference to FIG. 2.

The first substrate 101 may be a flexible substrate, and may be formed of plastic having high heat resistance and high endurance. However, exemplary embodiments are not limited thereto, and the first substrate 101 may be formed of various materials, e.g., metal or glass.

A barrier layer 103 may be formed on the first substrate 101. The barrier layer 103 functions to smooth the surface of the first substrate 101 and to prevent penetration of moisture or outside air. The barrier layer 103 may include an inorganic layer, e.g., a silicon oxide layer, an organic layer, e.g., a polyimide layer, or a stack of the inorganic layer and the organic layer.

At least one thin film transistor TFT may be formed in the active area AA and the circuit area CA. The thin film transistor TFT may be provided in plurality. For example, a first thin film transistor TFT1 and a second thin film transistor TFT2 may be disposed in the active area AA and the circuit area CA, respectively. However, this is merely exemplary, and embodiments are not limited thereto.

The first thin film transistor TFT1 disposed in the active area AA includes a first semiconductor active layer 204, a first gate electrode 205, a first source electrode 206, and a first drain electrode 207. A first gate insulating layer 208 and a second gate insulating layer 209 may be interposed between the first gate electrode 205 and the first semiconductor active layer 204 for insulation therebetween.

The second thin film transistor TFT2 disposed in the circuit area CA includes a second semiconductor active layer 210, a second gate electrode 211, a second source electrode 212, and a second drain electrode 213. The gate insulating layer 208 may be interposed between the second gate electrode 211 and the second semiconductor active layer 210 for insulation therebetween.

Since the first thin film transistor TFT1 further includes the second gate insulating layer 209 between the first semiconductor active layer 204 and the first gate electrode 205, the first thin film transistor TFT1 has a thicker gate insulating layer than the second thin film transistor TFT2. When a thin film transistor includes a thick gate insulating layer, a driving range of a gate voltage applied to a gate electrode may be wide. For example, when the first thin film transistor TFT1 is a driving thin film transistor driving an organic light-emitting device OLED, a driving range of the first thin film transistor TFT1 may be widened so that light emitted from the organic light-emitting device OLED may have abundant gradation. Also, since the first gate electrode 205 of the first thin film transistor TFT1 and the second gate electrode 211 of the second thin film transistor TFT2 are formed in different layers, i.e., at different heights relative to the first substrate 101, more devices may be disposed in the same area because no interference is generated even when the first thin film transistor TFT1 and the second thin film transistor TFT2 are disposed to be adjacent to each other.

The first semiconductor active layer 204 and the second semiconductor active layer 210 may be formed on the barrier layer 103. The first semiconductor active layer 204 and the second semiconductor active layer 210 may include an organic semiconductor or an inorganic semiconductor, e.g., amorphous silicon or polysilicon. The first gate insulating layer 208 is formed on the barrier layer 103 and covers the first semiconductor active layer 204 and the second semiconductor active layer 210.

The second gate electrode 211 is formed on the first gate insulting layer 208, and may overlap a portion of the second semiconductor active layer 210. The second gate insulating layer 209 covers the second gate electrode 211. The first gate electrode 205 is formed on the second gate insulting layer 209, and may overlap a portion of the first semiconductor active layer 204. The first gate electrode 205 and the second gate electrode 211 include a single layer or multiple layers of, e.g., gold (Au), silver (Ag), copper (Cu), Ni, platinum (Pt), palladium (Pd), aluminum (Al), molybdenum (Mo), or chromium (Cr), or include an alloy, e.g., an Al:Nd (neodymium) alloy or an Mo:W (tungsten) alloy.

The first gate insulating layer 208 and the second gate insulating layer 209 include an inorganic layer, e.g., a silicon oxide layer, a silicon nitride layer, or a metal oxide layer. The first gate insulating layer 208 and the second gate insulating layer 209 may be formed of a single layer or multiple layers as described above.

An interlayer insulating layer 214 covers the first gate electrode 205. The interlayer insulating layer 214 may be formed of an inorganic layer, e.g., a silicon oxide layer or a silicon nitride layer. In an exemplary embodiment, the interlayer insulating layer 214 may be formed of an organic layer.

The first source electrode 206 and the first drain electrode 207 are formed on the interlayer insulating layer 214 and contact the first semiconductor active layer 204 through a contact hole. Also, the second source electrode 212 and the second drain electrode 213 are formed on the interlayer insulating layer 214 and contact the second semiconductor active layer 210 through a contact hole. The first source electrode 206, the second source electrode 212, the first drain electrode 207, and the second drain electrode 213 include a metal, an alloy, a metal nitride, a conductive metal oxide, or a transparent conductive material.

The thin film transistor TFT is not limited to the above-described structure and may have various other structures. For example, although the thin film transistor TFT has been described as having a top gate structure, the thin film transistor TFT may be formed to have a bottom gate structure in which the first gate electrode 205 is disposed under the first semiconductor active layer 204.

A capacitor 215 may be formed in the circuit area CA. A capacitor may be formed in the active region.

The capacitor 215 includes a first capacitor electrode 216, a second capacitor electrode 217, and the second gate insulating layer 209 interposed therebetween. The first capacitor electrode 216 may be formed of the same material as the second gate electrode 211, and the second capacitor electrode 217 may be formed of the same material as the first gate electrode 205.

A planarization layer 218 is formed on the interlayer insulating layer 214 to cover the first and second thin film transistors TFT1 and TFT2 and the capacitor 215. The planarization layer 218 removes a step difference of the thin film transistor TFT and planarizes the same to increase the light emission efficiency of the organic light-emitting device OLED to be formed thereon. The planarization layer 218 may have a through hole for exposing a portion of the first drain electrode 207.

The planarization layer 218 may be formed of an insulating material. For example, the planarization layer 218 may be formed of a single layer structure or of a multilayer structure of, e.g., an inorganic material, an organic material, or an organic/inorganic compound, and may be formed by various deposition methods. In an exemplary embodiment, the planarization layer 218 may be formed of an organic material, e.g., a polyacrylate resin, an epoxy resin, or benzocyclobutene (BCB), or an inorganic material, e.g., silicon nitride (SiNx). However, exemplary embodiments are not limited thereto, and any one of the planarization layer 218 and the interlayer insulating layer 214 may be omitted.

The organic light-emitting device OLED is formed on the planarization layer 218. The organic light-emitting device OLED includes a first electrode 219, an intermediate layer 220 including an organic emission layer, and a second electrode 221.

A pixel definition layer 222 covers a portion of the first electrode 219 and the planarization layer 218, and defines a pixel area (PA) and a non-pixel area (NPA). The pixel definition layer 222 is formed of an organic material or an inorganic material. For example, the pixel definition layer 222 may be formed of an organic material, e.g., polyimide, polyamide, benzocyclobutene, an acryl resin, or a phenol resin, or an inorganic material, e.g., SiNx. The pixel definition layer 222 may include a single layer or multiple layers.

Holes and electrons injected from the first electrode 219 and the second electrode 221 of the organic light-emitting device OLED may be combined in the organic emission layer of the intermediate layer 220 to generate light. For example, the intermediate layer 220 may include the organic emission layer. In another example, the intermediate layer 122 includes the organic emission layer and may further include at least one of a hole injection layer (HIL), a hole transport layer (HTL), an electron transport layer (ETL), and an electron injection layer (EIL). However, exemplary embodiments are not limited thereto, and the intermediate layer 220 includes the organic emission layer and may further include various other functional layers.

The second electrode 221 may be formed on the intermediate layer 220. The second electrode 221 may form an electric field with the first electrode 219 so that light may be emitted from the intermediate layer 220. The first electrode 219 may be patterned in each pixel, and the second electrode 221 may be formed to apply a common voltage to all pixels.

The first electrode 219 and the second electrode 221 may have a transparent electrode or a reflective electrode. The first electrode 219 may function as an anode and may be formed of various conductive materials. The first electrode 219 may be formed as a transparent electrode or a reflective electrode.

For example, when the first electrode 219 is used as a transparent electrode, the first electrode 219 includes a transparent conductive layer of, e.g., indium tin oxide (ITO), indium zinc oxide (IZO), zinc oxide (ZnO), or indium oxide ($In_2O_3$). When the first electrode 219 is used as a reflective electrode, the first electrode 219 may be formed by forming a reflective layer of, e.g., gold (Ag), magnesium (Mg), aluminum (Al), platinum (Pt), palladium (Pd), silver (Ag), nickel (Ni), neodymium (Nd), iridium (Ir), chromium (Cr), or any compound thereof, and then forming a transparent conductive layer of, e.g., ITO, IZO, ZnO, or $In_2O_3$ on the reflective layer.

The second electrode 221 may function as a cathode. Like the first electrode 219, the second electrode 221 may be formed as a transparent electrode or a reflective electrode.

For example, when the second electrode 221 is used as a transparent electrode, the second electrode 221 may be formed by depositing a metal having a low work function, e.g., Li, Ca, LiF/Ca, LiF/Al, Al, Mg, or any compound thereof, on the intermediate layer 220, and then forming a transparent conductive layer of, e.g., ITO, IZO, ZnO, or $In_2O_3$ on the metal or the metal compound. When the second electrode 221 is used as a reflective electrode, the second electrode 221 may be formed of, e.g., Li, Ca, LiF/Ca, LiF/Al, Al, Mg, or any compound thereof.

The first electrode 219 may function as an anode, and the second electrode 221 may function as a cathode. However, exemplary embodiments are not limited thereto. For example, the first electrode 219 may function as a cathode, and the second electrode 221 may function as an anode.

A spacer 234 may be disposed in the non-pixel area (NPA). The spacer 234 may be disposed between the first substrate 101 and the second substrate 102 to maintain the distance between the first substrate 101 and the second substrate 102. By disposing the spacer 234, the display characteristics may not be degraded by an external impact. The spacer 234 may be formed on the pixel definition layer 222 to protrude from the pixel definition layer 222 toward the second substrate 102. The second electrode 221 may be formed on the spacer 234, e.g., the second electrode 221 may be formed conformally on the intermediate layer 220 and the spacer 234.

Various circuit patterns may be formed in the circuit area CA. For example, a power supply pattern, an electrostatic prevention pattern, and various other circuit patterns may be formed in the circuit area CA.

In an exemplary embodiment, a circuit line 223 is formed in the circuit area CA. The circuit line 223 may be formed on the planarization layer 218. The circuit line 223 may be formed of the same material as the first electrode 219. The circuit line 223 may be electrically connected to the second electrode 221 of the organic light-emitting device OLED.

The circuit line 223 is connected to the power line 224. The power line 224 may be formed on the interlayer insulating layer 214. The power line 224 may be formed of the same material as the first source electrode 206, the second source electrode 212, the first drain electrode 207, and the second drain electrode 213. External power may be applied through the power line 224.

The second substrate 102 is joined onto the first substrate 101. The second substrate 102 may prevent, e.g., protect, the organic light-emitting device OLED and other thin films from external moisture or oxygen. The second substrate 102 may be, e.g., a glass substrate having rigidity, a polymer substrate, or a flexible film. The second substrate 102 may have a structure in which an organic layer and an inorganic layer are alternately stacked.

The sealing portion 500 is installed between the first substrate 101 and the second substrate 102. The sealing portion 500 includes a first sealing portion 501 that is formed on the cell seal area CSA, and a second sealing portion 502 that is formed on the circuit area CA and extends from the first sealing portion 501. The first sealing portion 501 and the second sealing portion 502 may be united together. For example, the first and second sealing portions 501 and 502 may be a single, seamless structure, and the reference to the first and second sealing portions 501 and 502 is made merely to facilitate description of the sealing portion 500 with respect to the cell seal area CSA and the circuit area CA.

The first sealing portion 501 is formed in the cell seal area CSA. For example, as illustrated in FIG. 2, lower and upper surfaces of the first sealing portion 501 may directly contact the first and second substrates 101 and 102, respectively. The first sealing portion 501 may be disposed around the circuit area CA, e.g., the first sealing portion 501 may be disposed around the second sealing portion 502.

The second sealing portion 502 is formed in the circuit area CA. For example, as illustrated in FIG. 2, the second sealing portion 502 extends continuously from the first sealing portion 501 into the circuit area CA to at least partially overlap the first and second substrates 101 and 102, e.g., the second sealing portion 502 may overlap and directly contact the second substrate 102 and a power line 224. As described above, in order to reduce dead space while maintaining adhesion, at least a portion of the second sealing portion 502 directly contacts the power line 224 and a portion of the pixel definition layer 222, i.e., a first portion 250 of the pixel definition layer 222, in the circuit area CA.

For example, the second sealing portion 502 includes a first portion formed on the power line 224, a second portion formed on a portion of the pixel definition layer 222, and a third portion (D) formed on the circuit line 223. For example, the first portion of the second sealing portion 502 may extend from the first sealing portion 501 to be, e.g., directly, on the power line 224 and to contact a lateral surface of the portion of the pixel definition layer 222 facing the cell seal area CSA. For example, the second portion of the second sealing portion 502 may extend from the first portion of the second sealing portion 502 to be, e.g., directly, on the portion of the pixel definition layer 222, i.e., the first pixel definition layer 250, in the circuit area CA. For example, the third portion of the second sealing portion 502 may extend from the second portion of the second sealing portion 502 toward the active area AA to be on the circuit line 223.

The first portion, the second portion, and the third portion of the second sealing portion 502 may be united together. For example, the first through third portions of the second sealing portion 502 may be integral with each other to define a single, seamless structure surrounding the portion of the pixel definition layer 222 in the circuit area CA.

The sealing portion 500 including the first sealing portion 501 and the second sealing portion 502 includes glass frit. The glass frit includes glass powder and oxide powder. A gel-type paste is generated by adding an organic material to the glass frit including the oxide powder, and a laser is used to sinter the glass frit at a temperature range of about 300° C. to about 500° C. Accordingly, the organic material evaporates, and the gel-type paste may be hardened into solid frit.

In this case, if high-temperature heat caused by the sintering of the glass frit is transferred to the second sealing portion 502 extending to the circuit area CA in order to reduce a dead space, as described above, defects may be generated in the circuit area CA when foreign substances are potentially disposed under the glass frit. For example, if foreign substances were to be under the second sealing portion 502 during sintering thereof, the foreign substances could apply a downward pressure oriented from the second substrate 102 toward the first substrate 101. Accordingly, a portion of the circuit line 223, i.e., a portion having a width D in FIG. 2, could be deformed toward the first substrate 101, and an electrical short could be generated in the circuit line 223, e.g., when the circuit line 223 contacts the second source electrode 212 or the second drain electrode 213 of the second thin film transistor TFT2, as a deformation degree increases. Therefore, a separate buffer member may be formed in the circuit area CA, e.g., the portion of the pixel definition layer in the circuit area CA between the circuit line 223 and the second sealing portion 502, as will be described in detail with reference to FIG. 3.

Figure 3:
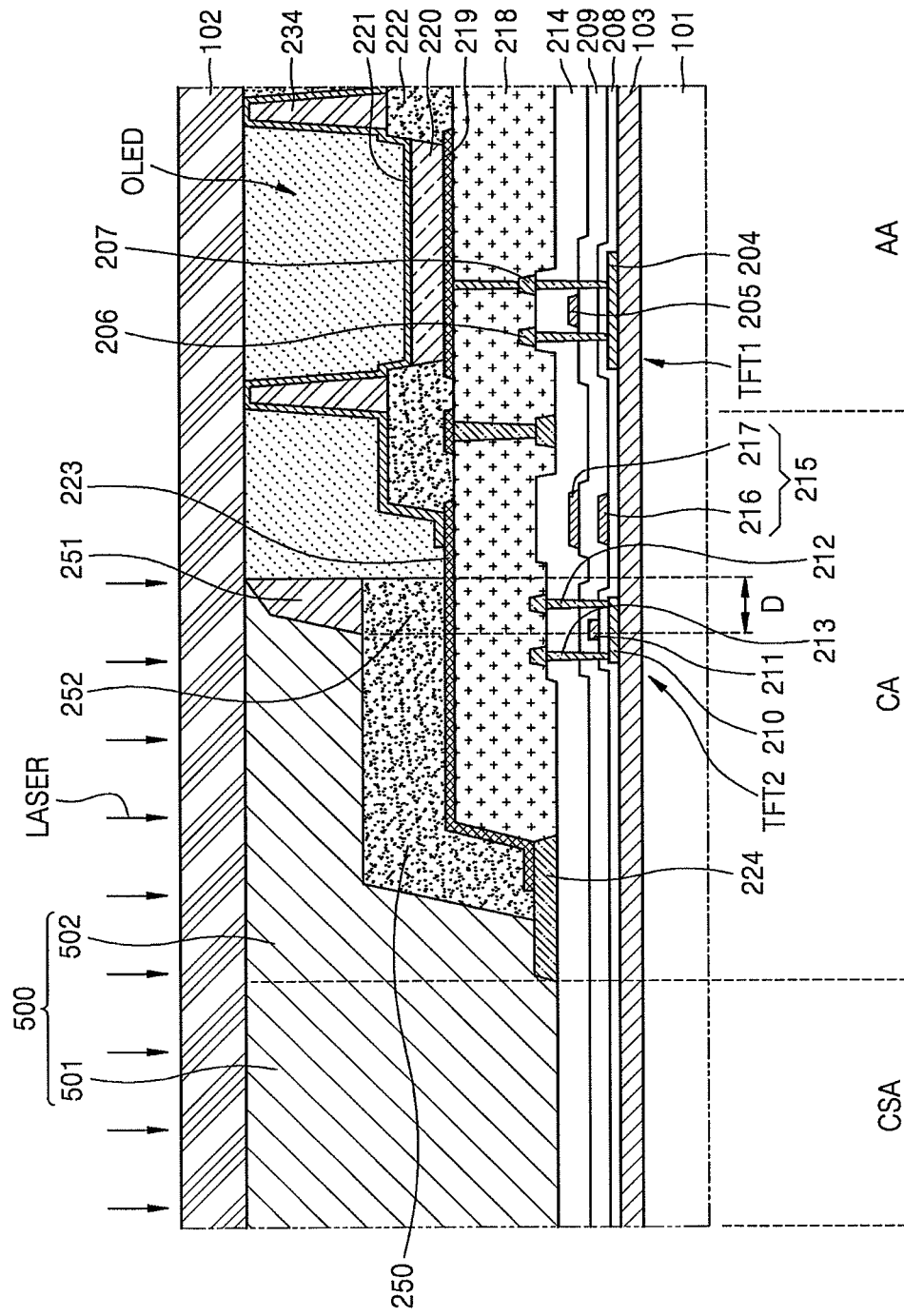
FIG. 3 illustrates a cross-sectional view of a portion of a display apparatus according to embodiments.

FIG. 3 illustrates a cross-sectional view of a portion of a display apparatus according to an exemplary embodiment. Since a detailed configuration of the display apparatus in FIG. 3 is substantially identical to the configuration illustrated in FIG. 2, redundant descriptions thereof will be omitted herein.

Referring to FIG. 3, the first pixel definition layer 250 extending across the circuit line 223 and the power line 224, and a second pixel definition layer 252 extending to the third portion (D) of the second sealing portion 502 are disposed on the circuit line 223. That is, as illustrated in FIG. 3, a portion of the pixel definition layer 222 in the circuit area CA includes the first pixel definition layer 250, e.g., substantially the same as the portion of the pixel definition layer 222 in the circuit area CA illustrated in FIG. 2, and the second pixel definition layer 252 extending on the circuit line 223 from the first pixel definition layer 250 toward the active area AA. For example, the second pixel definition layer 252 extends across a top surface of the circuit line 223 to overlap a region in which the second thin film transistor TFT2 is formed. For example, the second pixel definition layer 252 may be formed of the same material and in the same process as the first pixel definition layer 250. For example, the second pixel definition layer 252 extends from the first pixel definition layer 250 toward the active area AA to a same distance as the second sealing portion 502.

In detail, the second pixel definition layer 252 may be disposed on the circuit line 223 to function as a buffer member. For example, the second pixel definition layer 252 may, e.g., completely, separate the second sealing portion 502 from the circuit line 223. For example, since the second pixel definition layer 252 is disposed to cover the circuit line 223 at the third portion (D) of the second sealing portion 502 (at which the second thin film transistor TFT2 is disposed), it is possible to prevent a direct contact between a foreign substance, which may be generated in the process of forming the second sealing portion 502, and the circuit line 223 formed at the third portion (D). In addition, since the second pixel definition layer 252 may absorb a downward pressure caused by the foreign substance that may be generated in the process of forming the second sealing portion 502, the second pixel definition layer 252 may function as a buffer member to prevent the deformation of the circuit line 223. Accordingly, a contact between the circuit line 223 and a second source electrode 212 or a second drain electrode 213 of the second thin film transistor TFT2 may be prevented, thereby preventing an electrical short between the circuit line 223 and the second source electrode 212 (or the second drain electrode 213).

A column portion 251 as an additional buffer member may be disposed on the second pixel definition layer 252, e.g., the column portion 251 may be formed in the third region of the second sealing portion 502 on the second pixel definition layer 252. The column portion 251 may be formed of a photosensitive material in a body with the second pixel definition layer 252 through a photo process or a photolithography process. That is, the second pixel definition layer 252 and the column portion 251 may be simultaneously formed, e.g., to be integral with each other, by controlling an exposure amount in an exposure process by using a half-tone mask.

The column portion 251 may be disposed on the second pixel definition layer 252 to function as a buffer member. For example, since the column portion 251 is disposed on the second pixel definition layer 252 disposed at the third portion (D) of the second sealing portion 502, the column portion 251 may absorb a downward pressure caused by foreign substances that may be generated in the process of forming the second sealing portion 502. Thus, the column portion 251 may function as a buffer member to prevent the deformation of the circuit line 223. That is, both the second pixel definition layer 252 and the column portion 251 may prevent the deformation of the circuit line 223 by absorbing a force applied by foreign substances that may be generated in the process of joining a first substrate 101 and a second substrate 102 together by laser sealing. Accordingly, a contact between the circuit line 223 and the second source electrode 212 or the second drain electrode 213 of the second thin film transistor TFT2 may be prevented, thereby preventing an electrical short therebetween.

In the present embodiment, the column portion 251 is described as being disposed in the third portion (D) of the second sealing portion 502 on the second pixel definition layer 252. However, exemplary embodiments are not limited thereto. For example, when the circuit line 223 overlaps, i.e., is above, the thin film transistor TFT, the column portion 251 may be disposed, e.g., directly, on a portion of the circuit line 223 at which the thin film transistor TFT is disposed, in order to prevent the deformation of the circuit line 223.

Figure 4:
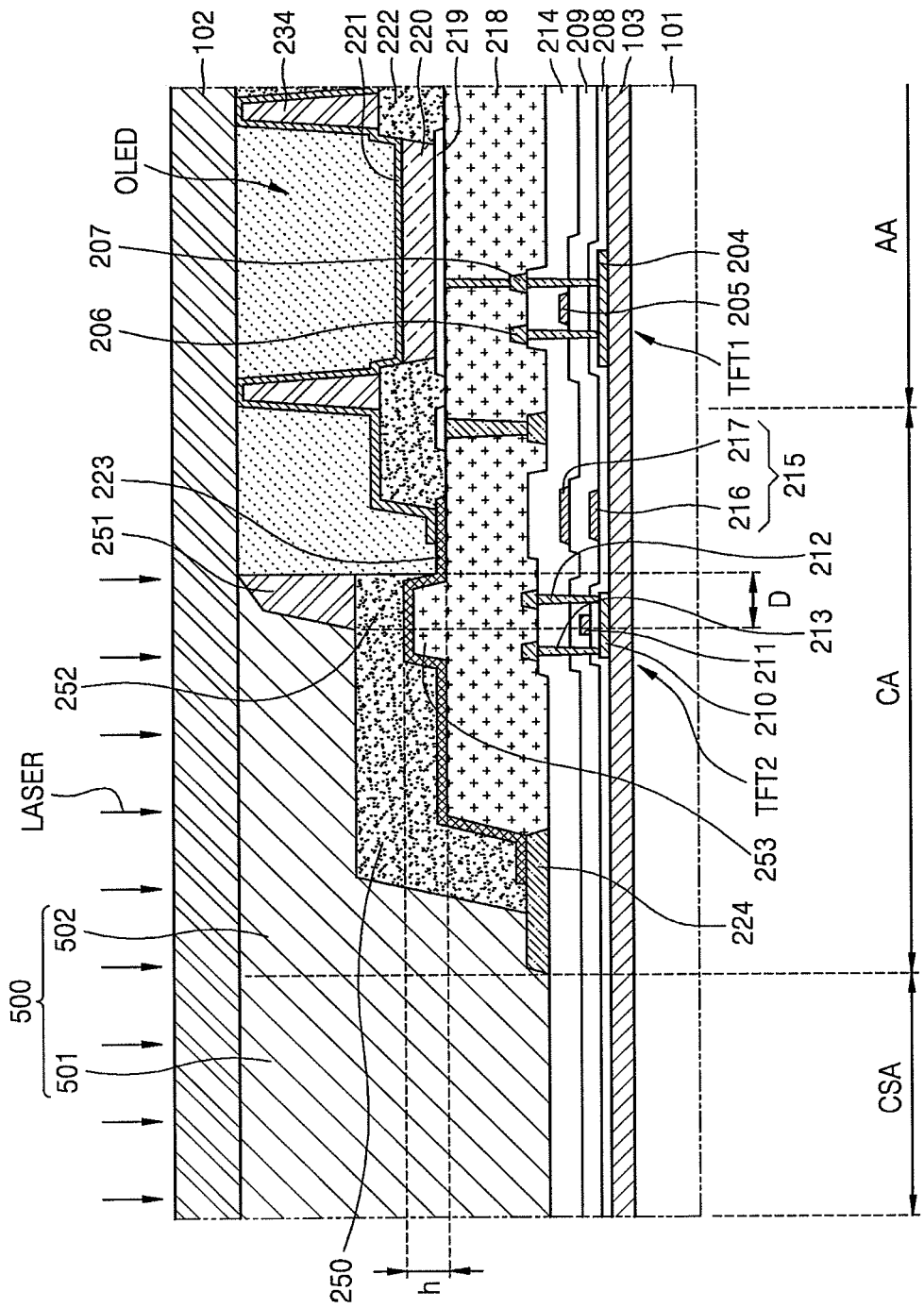
FIG. 4 illustrates a cross-sectional view of a portion of a display apparatus according to embodiments.

FIG. 4 illustrates a cross-sectional view schematically illustrating a portion of a display apparatus 1 according to another exemplary embodiment. Since a detailed configuration of the display apparatus illustrated in FIG. 4 is substantially identical to the configuration illustrated in FIG. 2, redundant descriptions thereof will be omitted herein.

Referring to FIG. 4, a step portion 253 having a predetermined height may be formed in the planarization layer 218 under the circuit line 223. The step portion 253 may be formed in a body, i.e., integrally, with the planarization layer 218 through a photo process or a photolithography process. That is, the step portion 253 may be formed simultaneously with the planarization layer 218 by controlling an exposure amount in an exposure process by using a half-tone mask.

The step portion 253 may be disposed under the circuit line 223 to function as a buffer member. For example, since the step portion 253 is disposed under the circuit line 223 at a region corresponding to, i.e., overlapping, the third portion (D) of the second sealing portion 502, the step portion 253 may absorb a downward pressure caused by foreign substances generated in the process of forming the second sealing portion 502. Thus, the step portion 253 may function as a buffer member to prevent the deformation of the circuit line 223. Accordingly, since contact between the circuit line 223 and the second source electrode 212 or the second drain electrode 213 of the second thin film transistor TFT2 may be prevented, an electrical short between the circuit line 223 and the second source electrode 212 (or the second drain electrode 213) may be prevented.

In the present embodiment, the step portion 253 is described as being disposed to overlap and extend toward the third portion (D) of the second sealing portion 502, and as having a predetermined height h. However, exemplary embodiments are not limited thereto. For example, when the circuit line 223 disposed on the thin film transistor TFT overlaps the step portion 253 to minimize deformation, the height h of the step portion 253 may be adjusted, e.g., increase, in proportion to a buffering degree that is required between a top surface of the planarization layer 218 and a second substrate 102.

As described above, according to the one or more of the above exemplary embodiments, a display apparatus may include a buffer on a portion of a circuit line overlapping a thing film transistor in a circuit area. As such, the buffer may prevent the deformation of a circuit area, e.g., potentially caused by foreign substances during a sealing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a first substrate;
    a second substrate over the first substrate;
    an organic light-emitting device located between the first substrate and the second substrate, the organic light-emitting device comprising a first electrode, a second electrode, and an intermediate layer comprising an organic emission layer;
    a sealant between the first substrate and the second substrate, the sealant being outside of the organic light-emitting device and not overlapping the organic light-emitting device in a plan view;
    a thin film transistor located outside of the organic light-emitting device and comprising an active layer, a gate electrode and source/drain electrodes, the thin film transistor overlapping the sealant in the plan view;
    a circuit line located outside the organic light-emitting device and in contact with the second electrode, the circuit line overlapping the sealant and the thin film transistor in the plan view;

a power line between the first substrate and the circuit line and in contact with the circuit line;

a first buffer between the sealant and the circuit line to separate the sealant and the circuit line, the first buffer being different in material from the sealant; and a second buffer between the second substrate and a top surface of the first buffer, wherein the first buffer and the second buffer comprise a same material.

2. The display apparatus as claimed in claim 1, wherein the same material comprises an organic material.

3. The display apparatus as claimed in claim 1, wherein the first buffer overlaps the circuit line in the plan view.

4. The display apparatus as claimed in claim 3, wherein the second buffer overlaps the first buffer in the plan view.

5. The display apparatus as claimed in claim 1, further comprising:

an insulating layer between the first substrate and the power line; and a planarization layer between the circuit line and the thin film transistor, wherein the circuit line is a separate element from the thin film transistor, and a portion of the circuit line is between the first buffer and the thin film transistor.

6. The display apparatus as claimed in claim 5, wherein the power line is directly on the insulating layer.

7. The display apparatus as claimed in claim 6, wherein a bottom surface of the sealant directly contacts the insulating layer, a part of the power line and the first buffer.

8. The display apparatus as claimed in claim 5, further comprising a step portion between the circuit line and the planarization layer.

9. The display apparatus as claimed in claim 8, wherein the planarization layer and the step portion are united together.

10. The display apparatus as claimed in claim 8, wherein the step portion is on the thin film transistor.

11. The display apparatus as claimed in claim 8, wherein the step portion is a protrusion extending above the planarization layer, the circuit line being conformal on the step portion.

12. The display apparatus as claimed in claim 1, wherein an upper surface of the sealant contacts the second substrate.

13. The display apparatus as claimed in claim 1, wherein the circuit line is formed of the same material as the first electrode, and the circuit line is spaced from the first electrode.

14. The display apparatus as claimed in claim 1, wherein the sealant comprises a glass frit.

15. A display apparatus, comprising:

a first substrate;

a second substrate over the first substrate;

an organic light-emitting device located between the first substrate and the second substrate, the organic light-emitting device comprising a first electrode, a second electrode, and an intermediate layer comprising an organic emission layer;

a sealant between the first substrate and the second substrate, the sealant being outside of the organic light-emitting device, the sealant comprising a first portion and a second portion located between the first portion and the organic light-emitting device;

a thin film transistor located outside of the organic light-emitting device and comprising an active layer, a gate electrode and source/drain electrodes, the thin film transistor overlapping the second portion of the sealant in a plan view;

a circuit line located outside the organic light-emitting device and in contact with the second electrode, the circuit line overlapping the second portion of the sealant and the thin film transistor in the plan view;

a power line between the first substrate and the circuit line and in contact with the circuit line, the power line overlapping the second portion of the sealant;

a first buffer between the second portion of the sealant and the circuit line to separate the sealant and the circuit line, the first buffer being different in material from the sealant; and a second buffer between the second substrate and a top surface of the first buffer, wherein the first buffer and the second buffer comprise a same material.

* * * * *